United States Patent
Kobayashi et al.

(10) Patent No.: US 9,150,964 B2
(45) Date of Patent: Oct. 6, 2015

(54) VACUUM PROCESSING APPARATUS

(75) Inventors: Hiroyuki Kobayashi, Kodaira (JP); Masaru Izawa, Hino (JP); Kenetsu Yokogawa, Tsurugashima (JP); Kenji Maeda, Koganei (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 1618 days.

(21) Appl. No.: 12/191,373

(22) Filed: Aug. 14, 2008

(65) Prior Publication Data

US 2009/0301392 A1    Dec. 10, 2009

(30) Foreign Application Priority Data

Jun. 6, 2008   (JP) .................................. 2008-149021

(51) Int. Cl.
*C23C 14/00* (2006.01)
*C23C 16/44* (2006.01)
*H01L 21/67* (2006.01)
*H01L 21/677* (2006.01)

(52) U.S. Cl.
CPC ...... *C23C 16/4401* (2013.01); *H01L 21/67201* (2013.01); *H01L 21/67745* (2013.01)

(58) Field of Classification Search
CPC ..................... C23C 16/4401; H01L 21/67201; H01L 21/67745
See application file for complete search history.

(56) References Cited

U.S. PATENT DOCUMENTS

| | | | |
|---|---|---|---|
| 5,223,001 A | 6/1993 | Saeki | |
| 5,578,129 A * | 11/1996 | Moriya | ......................... 118/719 |
| 5,908,662 A * | 6/1999 | Fu | .............. 427/248.1 |
| 2003/0129044 A1 * | 7/2003 | Kunze et al. | ................... 414/217 |
| 2004/0154538 A1 * | 8/2004 | Carpenter et al. | ............. 118/719 |
| 2004/0194268 A1 * | 10/2004 | Halsey et al. | ................ 29/25.01 |

FOREIGN PATENT DOCUMENTS

| | | |
|---|---|---|
| JP | 5-140743 | 6/1993 |
| JP | 08-064582 | 3/1996 |
| JP | 11-111681 | 4/1999 |

OTHER PUBLICATIONS

Hori et al., JP 11-111681; Apr. 23, 1999 (Machine Translation).*
Japan Office Action in JP 2008-149021 with mailing date of Feb. 5, 2013 and partial English language translation.

* cited by examiner

*Primary Examiner* — Parviz Hassanzadeh
*Assistant Examiner* — Nathan K Ford
(74) *Attorney, Agent, or Firm* — Baker Botts L.L.P.

(57) ABSTRACT

There is a vacuum processing apparatus which can reduce the amount of foreign particle occurrence by enhancing the ease of maintenance of a gas diffuser installing portion in the vacuum processing apparatus. A gas diffuser chamber for accommodating a gas diffuser is installed in the vacuum processing apparatus.

6 Claims, 14 Drawing Sheets

VACUUM PROCESSING APPARATUS

CLAIM OF PRIORITY

The present invention claims priority from Japanese patent application JP 2008-149021 filed on Jun. 6, 2008, the content of which is hereby incorporated by reference into this application.

FIELD OF THE INVENTION

The present invention relates to a vacuum processing apparatus, and more particularly, to an installation configuration and an installation method of a gas diffuser in a semiconductor manufacturing apparatus.

BACKGROUND OF THE INVENTION

In manufacturing processes of semiconductor devices such as DRAMs or microprocessors, plasma etching and plasma CVD are widely used. One of the issues in the manufacturing processes of semiconductor devices is to reduce the number of foreign particles attaching to a sample to be processed. For example, in a semiconductor manufacturing apparatus for etching, if foreign particles fall on a fine pattern of a sample before etching, the region is locally hindered from being etched. This causes a failure such as breaking of wire and reduces the yield. On this account, there have been contrived a number of methods for preventing foreign particles from attaching to the sample in the semiconductor manufacturing apparatus and a semiconductor inspection apparatus for inspecting the sample in the course of the manufacturing process. For example, Japanese Patent Application Laid-Open No. 8(1996)-64582 describes a method for installing a gas diffuser to prevent the fly-off of foreign particles during venting in a lock chamber for switching between a vacuum and the atmosphere. In this context, the term "venting" refers to switching from a vacuum to the atmosphere by purging nitrogen gas or the like. The gas diffuser prevents a rapid gas flow in a specific direction, and is disclosed, for example, in Japanese Patent Application Laid-Open No. 8(1996)-64582.

SUMMARY OF THE INVENTION

In the lock chamber, the gas diffuser has to be so installed that a transfer arm or the sample does not touch the gas diffuser during the transfer of the sample. However, there is a tendency to minimize the volume of the lock chamber in order to reduce vent time and vacuuming time, which disadvantageously makes it difficult to secure enough space for accommodating the gas diffuser in the lock chamber. If the gas diffuser is installed in a minimal space where the distance between the gas diffuser and a wall surface is too small, there is a high risk that foreign particles attaching to the wall surface around the gas diffuser peel and fly off in the lock chamber due to the flow of supplied vent gas so that foreign particles attach to the sample.

Further, it is desirable to remove and thoroughly clean an area around the gas diffuser at the time of periodic wet cleaning (overhaul cleaning of swap parts). However, in most cases, the lock chamber itself is not designed to be cleaned by removal at the time of wet cleaning. Accordingly, in the case where the gas diffuser is installed directly in the lock chamber, it is not easy to clean the area around the gas diffuser in the lock chamber by ultrasonic pure water cleaning or the like at the time of periodic wet cleaning.

Further, from the viewpoint of preventing the fly-off of foreign particles during venting in a processing chamber, a gas diffuser may be installed also in the processing chamber. However, since ion and deposition radical or corrosive radical exist in the processing chamber, if the gas diffuser is installed in an exposed state in the processing chamber, the gas diffuser may be contaminated by these substances.

The whole of the gas diffuser disclosed in Japanese Patent Application Laid-Open No. 8(1996)-64582 is installed directly in the lock chamber through the use of a gas introduction pipe, which does not solve the above problems.

SUMMARY OF THE INVENTION

It is an object of the present invention to provide a vacuum processing apparatus which can reduce the amount of foreign particle occurrence by enhancing the ease of maintenance of a gas diffuser installing portion in the vacuum processing apparatus.

A representative example of the invention is a vacuum processing apparatus comprising a lock chamber capable of switching between an atmosphere and a vacuum; a vacuum transfer chamber; and a vacuum processing chamber, wherein the vacuum processing apparatus further comprises a gas diffuser for venting the lock chamber, and a dedicated chamber for accommodating the gas diffuser only, wherein the dedicated chamber is removably connected to the lock chamber.

According to the invention, it is possible to facilitate the maintenance of a gas diffuser installing portion and reduce the occurrence number of foreign particles.

DETAILED DESCRIPTION OF THE PREFERRED EMBODIMENTS

According to a representative embodiment of the present invention, in a semiconductor manufacturing apparatus including a processing chamber, a vacuum transfer chamber, a lock chamber, and an atmospheric transfer chamber, a gas diffuser chamber for accommodating a gas diffuser is connected to the lock chamber. According to another embodiment, two gate valves are installed at a connection port for connecting the processing chamber with the vacuum transfer chamber, and a gas diffuser is installed in an area sandwiched between the two gate valves. Hereinafter, referring to the accompanying drawings, embodiments of the invention will be described taking a plasma processing apparatus as an example.

First Embodiment

A first embodiment of the invention will be described with reference to FIGS. 1 to 8.

Figure 1:
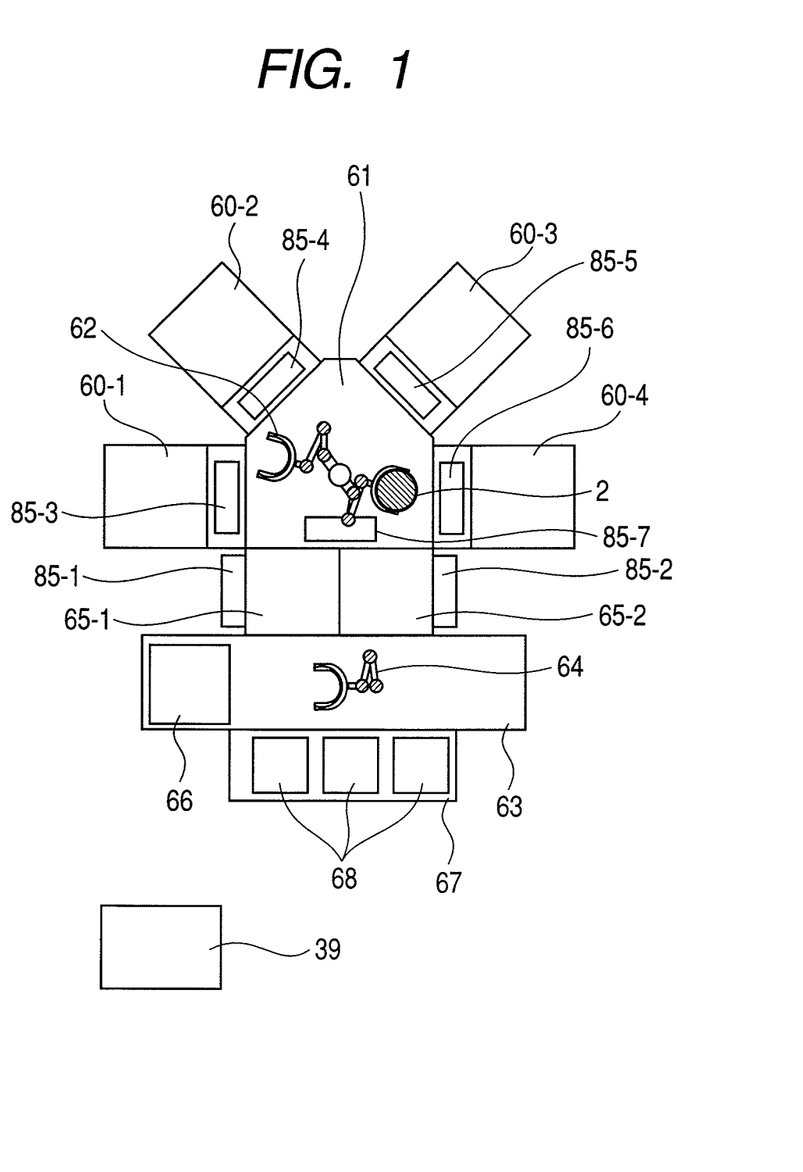
FIG. 1 is a top view showing the general configuration of a plasma processing apparatus according to an embodiment of the present invention.

FIG. 1 is a top view showing the general configuration of a plasma processing apparatus. In the plasma processing apparatus, four plasma processing chambers 60 (60-1 to 60-4) are connected to a vacuum transfer chamber 61. The vacuum transfer chamber 61 and an atmospheric transfer chamber 63 are connected to each other through two lock chambers 65 (65-1, 65-2) capable of switching between the atmosphere and a vacuum. For example, the lock chambers 65-1 is a load lock chamber, and the lock chambers 65-2 is used as an unload lock chamber. The load lock chamber is used in transferring a sample from the atmospheric transfer chamber to the vacuum transfer chamber, whereas the unload lock chamber is used in transferring a sample from the vacuum transfer chamber to the atmospheric transfer chamber. As a matter of course, each lock chamber may be used as both the load lock chamber and the unload lock chamber. In the atmospheric transfer chamber 63, a wafer aligner 66 for detecting the center and the notch position of a sample 2 is installed. Further, a wafer station 67 for accommodating front opening unified pods (FOUP) 68 for storing wafers is connected to the atmospheric transfer chamber. Further, a computer 39 for controlling the whole of the plasma processing unit is installed. Further, gas diffuser chambers 85 (85-1 and 85-2) for accommodating gas diffusers are connected to the lock chambers 65-1 and 65-2, respectively. Furthermore, gas diffuser chambers 85 (85-3 and 85-6) for accommodating gas diffusers are installed near the respective connection ports between processing chambers 60 (60-1 to 60-4) and the vacuum transfer chamber 61. Furthermore, a gas diffuser chamber 85-7 for accommodating a gas diffuser is installed above the vacuum transfer chamber 61.

Figure 2:
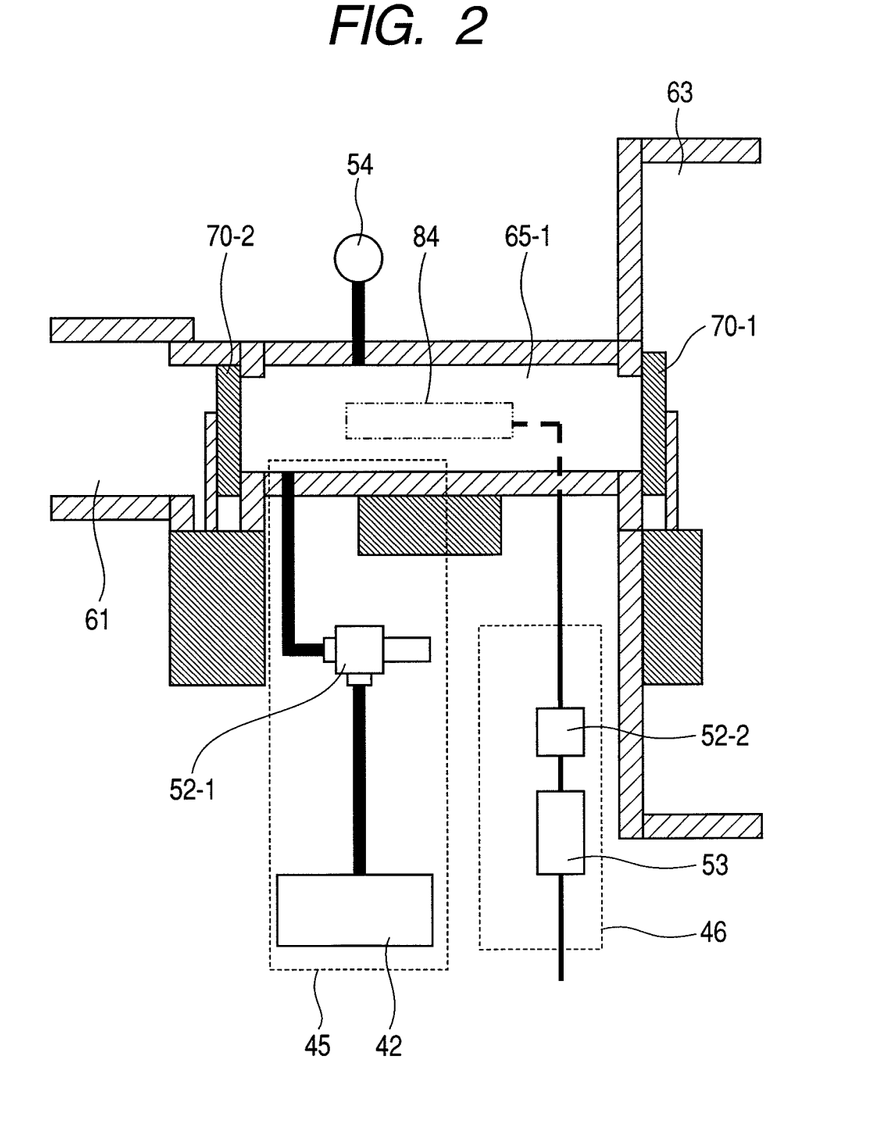
FIG. 2 is a schematic longitudinal sectional view of a lock chamber shown in FIG. 1.

Next, the configuration of a pumping system and a vent gas supply system of a lock chamber will be described with reference to FIG. 2. FIG. 2 is a schematic longitudinal sectional view of the lock chamber 65-1. Gate valves 70-1 and 70-2 are provided at respective connection ports for connecting the lock chamber 65-1 with the atmospheric transfer chamber 63 and the vacuum transfer chamber 61. Although not shown, a gas diffuser chamber for installing a gas diffuser 84 at an outer surface of the lock chamber 65-1 is removably fixed to a wall surface perpendicular to side faces where the gate valves 70-1 and 70-2 are installed. In the lock chamber 65-1, a vacuum pumping system 45 for depressurizing the lock chamber and a vent gas supply system 46 for supplying vent gas during venting are installed. In this context, the term "venting" refers to switching from a vacuum to the atmosphere by supplying gas such as nitrogen. The vent gas refers to gas that is supplied during venting. The vacuum pumping system 45 is composed of a slow open valve 52-1 and a dry pump 42. The slow open valve is a valve that can adjust the open speed of a valve element, and has the effect of easing rapid depressurization of the lock chamber by slowly opening the valve at the start of vacuuming. The vent gas supply system 46 is composed of a regulator 53 for reducing the pressure of vent gas such as nitrogen gas supplied from the source (not shown) of the vent gas, a valve 52-2, and the gas diffuser 84. Further, a pressure gauge 54 for measuring pressure is provided in the lock chamber. The vacuum pumping system 45 and the vent gas supply system 46 are controlled by the computer 39.

Figure 3:
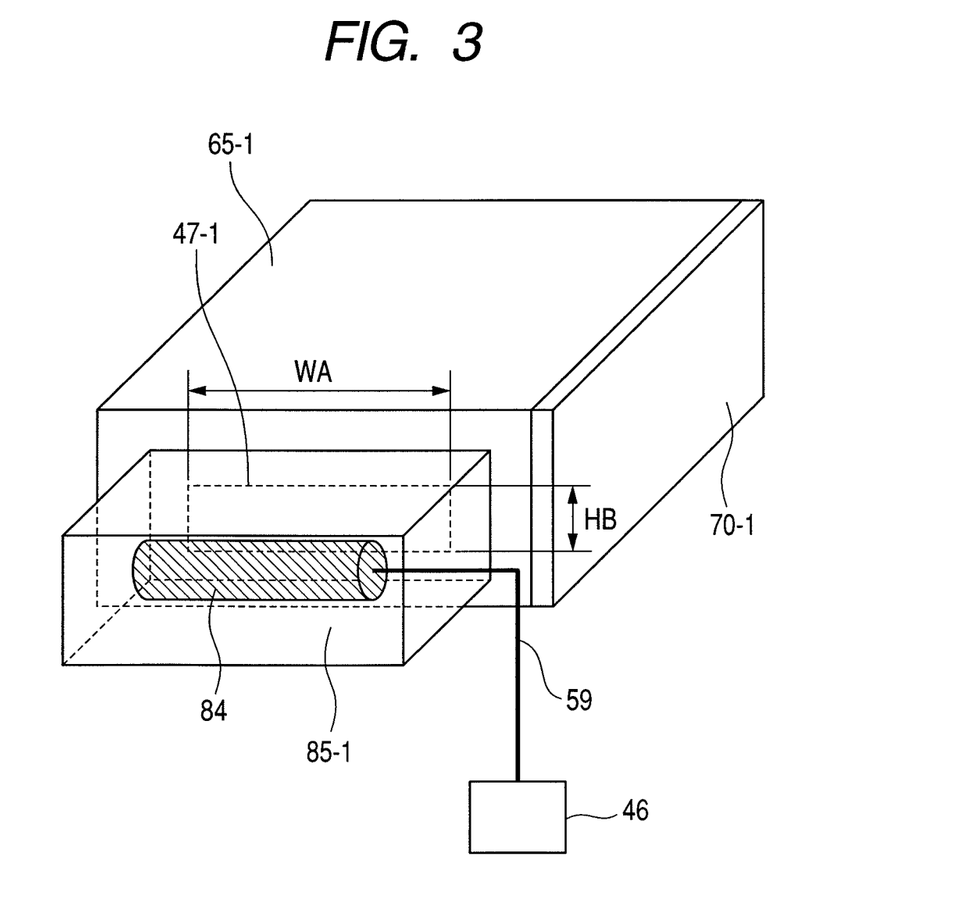
FIG. 3 is a schematic view sterically showing a gas diffuser chamber connected to the lock chamber in FIG. 1.
Figure 4:
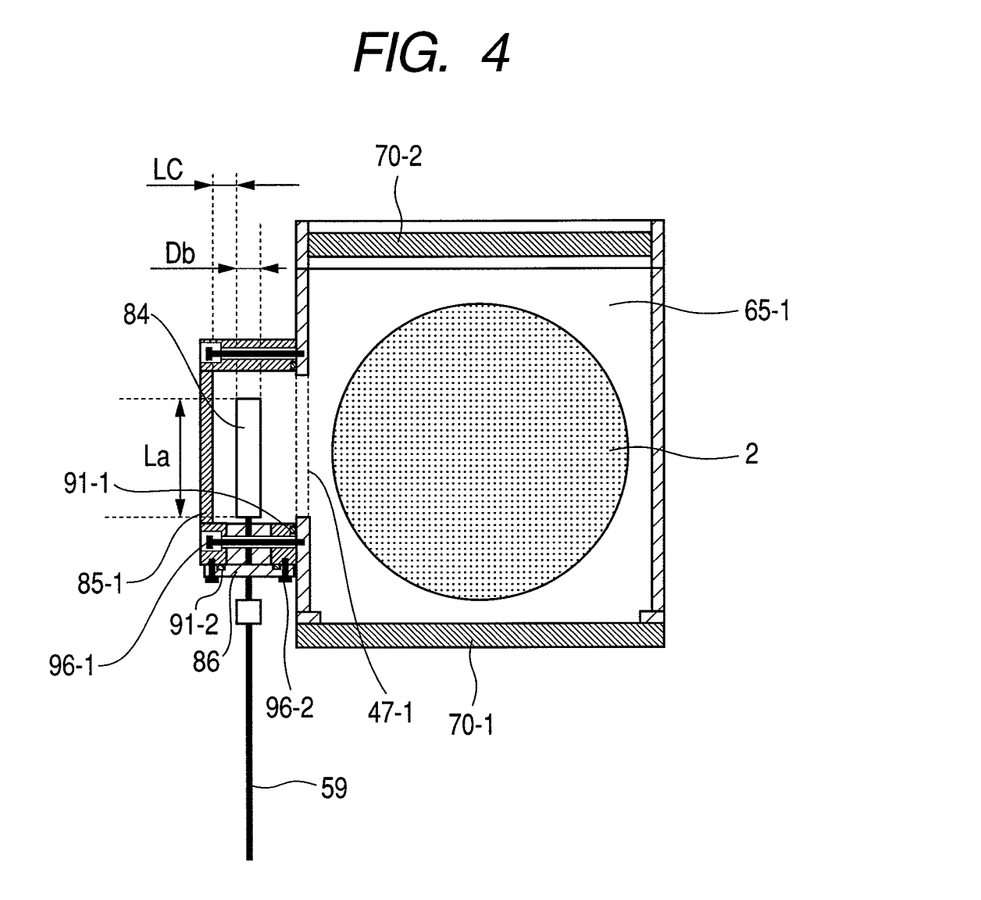
FIG. 4 is a schematic sectional view of the gas diffuser chamber according a first embodiment.
Figure 5:
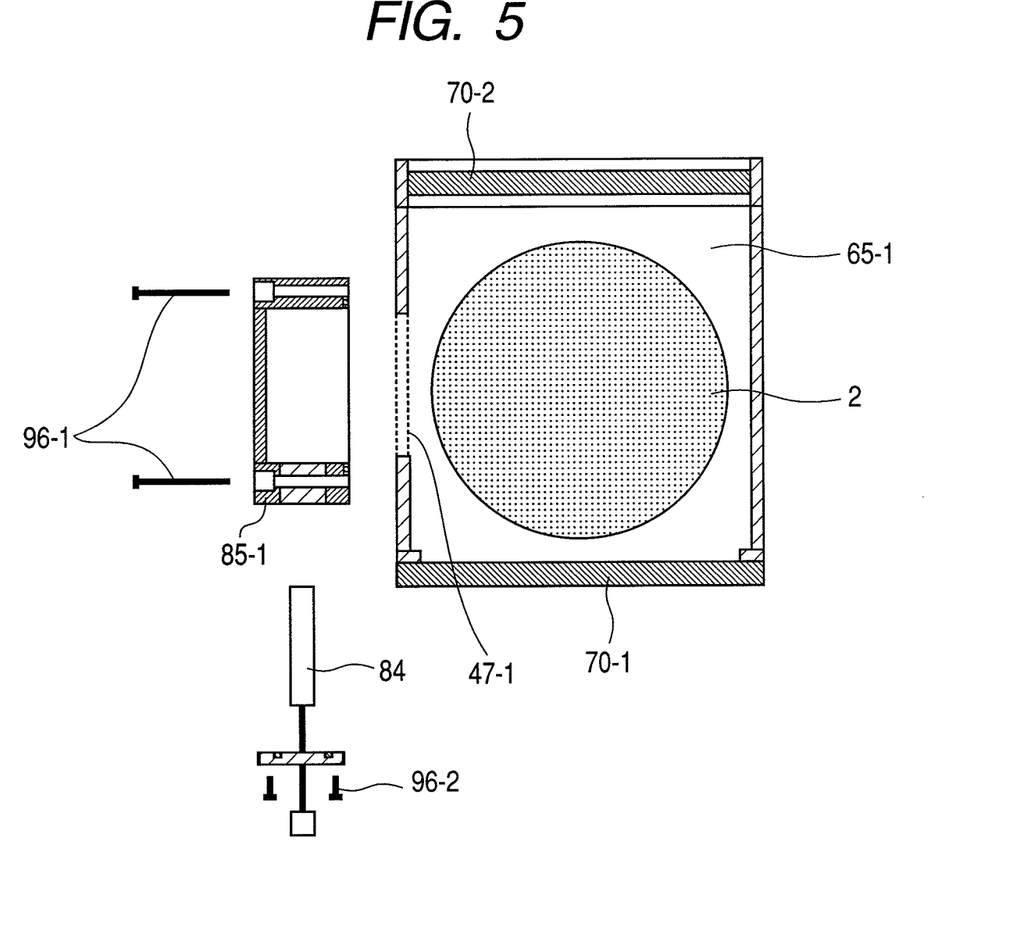
FIG. 5 is a schematic sectional view in which a gas diffuser according the first embodiment is removed from the gas diffuser chamber and the gas diffuser chamber is removed from the lock chamber.
Figure 6:
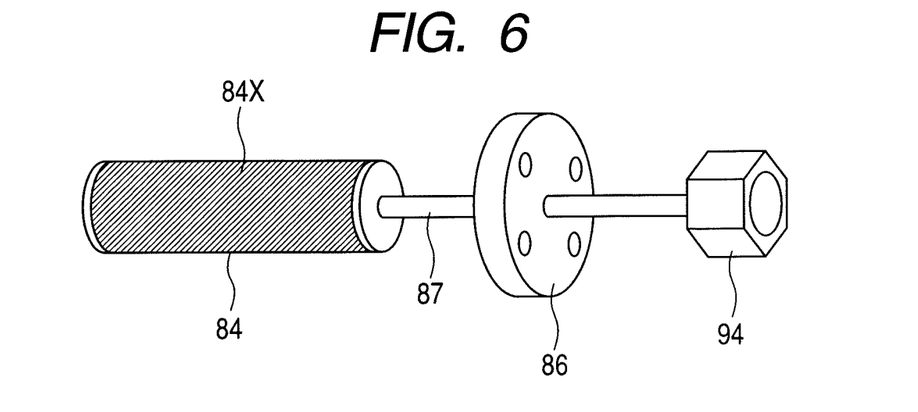
FIG. 6 is a perspective view showing the configuration of a flange and the gas diffuser removed from the gas diffuser chamber.

Next, the gas diffuser chambers 85 which are dedicated chambers for accommodating gas diffusers will be described with reference to FIGS. 3 to 6. The following description will be made by taking as an example the gas diffuser chamber 85-1 connected to the lock chamber 65-1. FIG. 3 is a schematic view sterically showing the gas diffuser chamber connected to the lock chamber. FIG. 4 is a schematic sectional view of the gas diffuser chamber. FIG. 5 is a schematic sectional view in which the gas diffuser is removed from the gas diffuser chamber and the gas diffuser chamber is removed from the lock chamber. FIG. 6 is a perspective view showing the configuration of a flange and the gas diffuser removed from the gas diffuser chamber.

As shown in FIG. 3, the gas diffuser chamber 85-1 is fixed to a lateral surface of the lock chamber 65-1. The slender cylindrical gas diffuser 84 is installed in the gas diffuser chamber 85-1 along the lateral surface of the lock chamber 65-1. A space within the gas diffuser chamber 85-1 is connected to a space within the lock chamber 65-1 through a connection port 47-1 provided on the lock chamber 65-1. The height and width of the gas diffuser chamber 85-1 are smaller than the height and width of the lock chamber 65-1. Further, the top face of the lock chamber 65-1 can be opened and closed for maintenance. On the top face of the lock chamber 65-1, there is provided a transparent window (not shown) for observing the state of a wafer.

In FIGS. 4 and 5, the gas diffuser chamber 85-1 has approximately the same height as the transfer path of the sample (e.g., wafer) 2 including the gate valves 70-1 and 70-2, and is provided thereoutside. The gas diffuser chamber 85-1 is fixed to the lock chamber by a screw 96-1 with an O-ring 91-1 in between. That is, the gas diffuser chamber can be removed from the lock chamber by removing the screw 96-1. Further, the gas diffuser 84 can be removed from the gas diffuser chamber by removing a screw 96-2.

As shown in FIG. 6, the gas diffuser 84 is connected to a stainless steel (SUS) pipe 87 passing through a flange 86. The opposite end of the SUS pipe 87 passing through the flange from the gas diffuser can be connected to a pipe 59 of the vent gas supply system by a gas pipe connection unit 94 such as VCR connection. The flange 86 is screwed into the gas diffuser chamber 85-1, thereby installing the gas diffuser 84 in the gas diffuser chamber. There is an O-ring groove on the flange 86, and an O-ring 91-2 is mounted therein. In FIG. 6, the surface of a portion of the gas diffuser 84 indicated by reference numeral 84X is a porous body. Gas is so supplied as to ooze through the porous body 84X, which can prevent a rapid gas flow in a specific direction.

Figure 7:
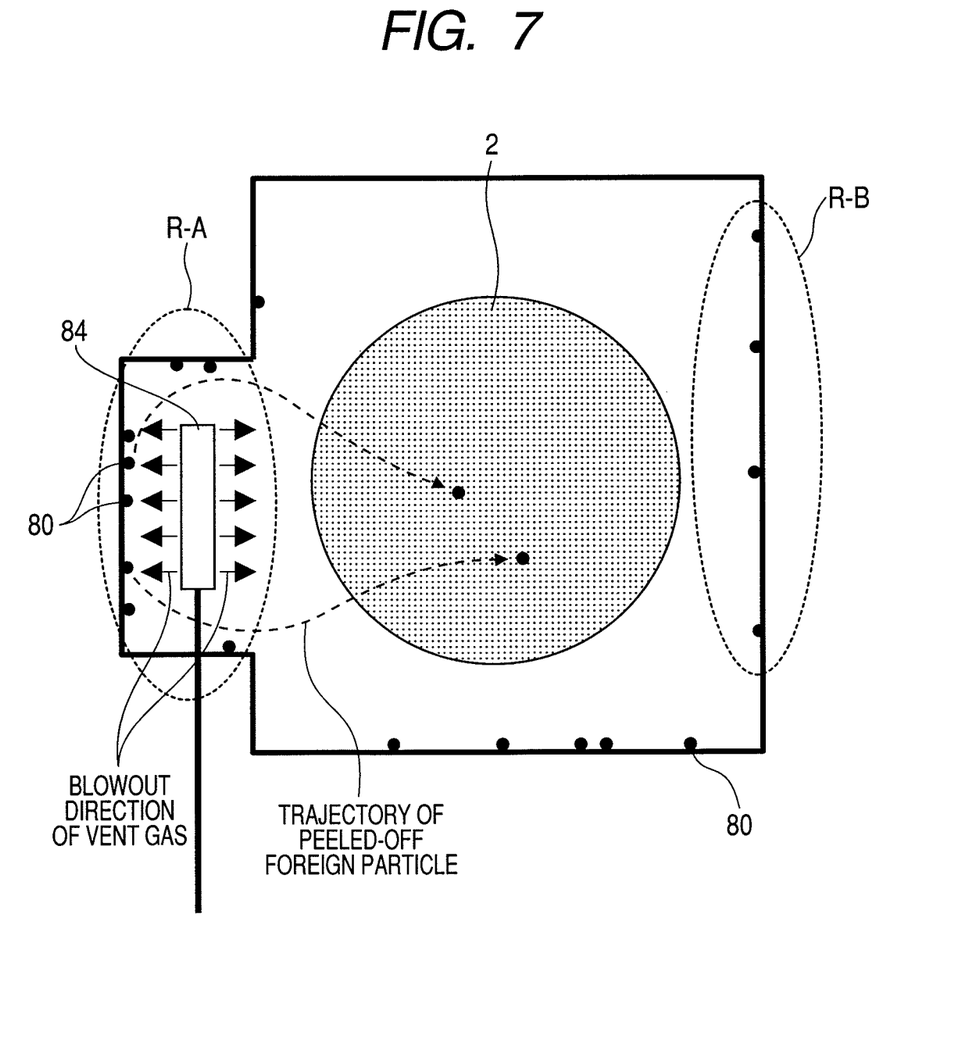
FIG. 7 is an operation explanatory view simplifying the lock chamber and the gas diffuser chamber shown in FIG. 4.

Next, referring to FIG. 7, description will be made as to the merits of the configuration in which the gas diffuser chamber 85 for accommodating the gas diffuser 84 is connected to the lock chamber and the gas diffuser chamber and the gas diffuser are removable. FIG. 7 is an operation explanatory view simplifying the lock chamber 65-1 and the gas diffuser chamber 85 shown in FIG. 4. It is almost impossible for existing cleaning techniques to bring about a state where foreign particles completely do not attach to the inner surfaces of the lock chamber and the gas diffuser chamber. Further, at actual mass production sites, the sample sometimes brings foreign particles into the lock chamber 65-1 when transferred into the lock chamber. For this reason, in most cases, foreign particles gradually accumulate in the lock chamber with operations, and the contamination level deteriorates.

FIG. 7 shows a contaminated state where such foreign particles 80 attach to the inner walls by operations. Further, solid arrows indicate blowout directions of vent gas supplied from the gas diffuser. In this case, for example, foreign particles 80 attaching to the right side (R-B area) of the lock chamber in FIG. 7 are far from the gas diffuser 84; accordingly, the risk that these foreign particles peel off the inner wall and fly off during venting is small. On the other hand, for example, foreign particles 80 attaching to the left side (R-A area) of the lock chamber in FIG. 7 are close to the gas diffuser 84; accordingly, vent gas supplied from the gas diffuser strikes these foreign particles. Although the gas diffuser relieves a rapid gas flow, there is a risk that foreign particles attaching to a wall very close to the gas diffuser peel and fly off due to a vent gas flow. For example, as shown by dotted arrows in FIG. 7, foreign particles 80 attaching to inner walls around the gas diffuser 84 may peel off and attach to the wafer 2. Accordingly, it is desirable to periodically clean the inner walls around the gas diffuser 84. If the gas diffuser is installed directly in the lock chamber, there arises a need to clean the lock chamber itself. However, in general, the lock chamber itself is not constructed to easily removed for cleaning at the time of periodic maintenance; therefore, it is difficult to clean the inner walls around the gas diffuser.

On the other hand, as in the invention, if the gas diffuser chamber 85 is installed to the lock chamber 65-1 and can be easily removed from the lock chamber, there is a merit that the gas diffuser chamber can be periodically cleaned by ultrasonic pure water cleaning or the like. Further, the gas diffuser 84 can be easily cleaned.

Figure 8A:
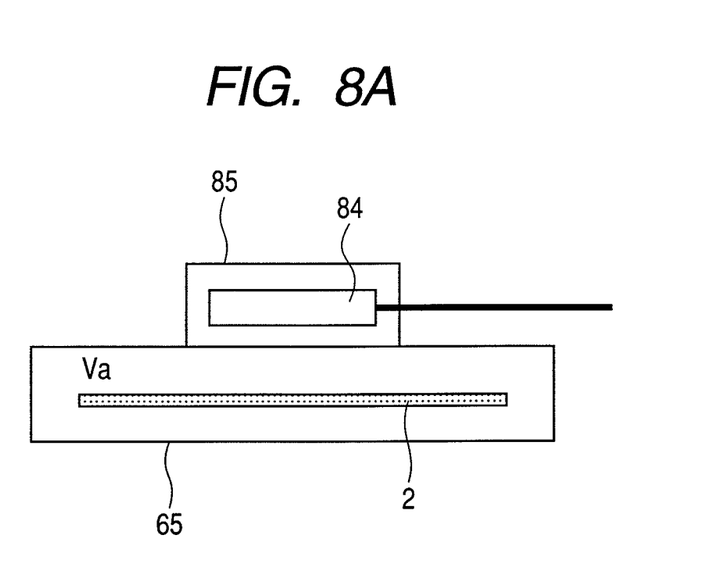
FIG. 8A is an illustration showing the case where the gas diffuser in the gas diffuser chamber is installed to the lock chamber.
Figure 8B:
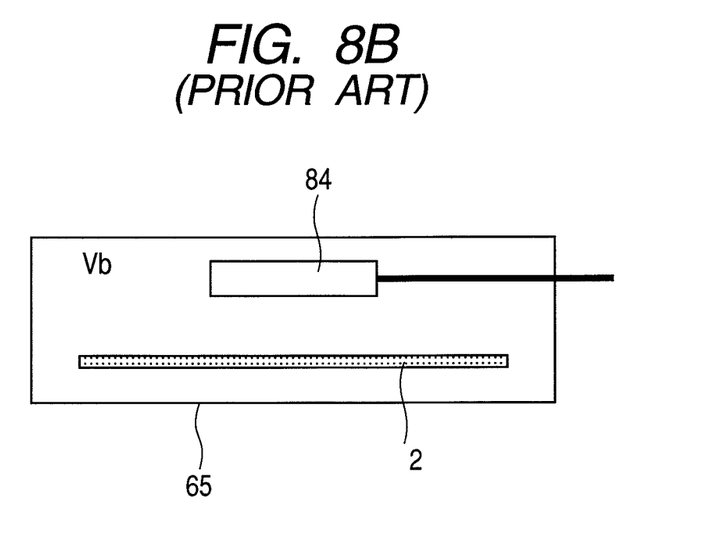
FIG. 8B is an illustration showing the case where the gas diffuser is installed directly in the lock chamber.

Next, in FIGS. 8A and 8B, a comparison will be made between the case (FIG. 8A) where the gas diffuser 84 in the gas diffuser chamber 85 is installed to the lock chamber 65 as in the invention and the case (FIG. 8B) where the gas diffuser 84 is installed directly in the lock chamber 65 as in conventional techniques such as Japanese Patent Application Laid-Open No. 8(1996)-64582. To simplify the description, in the example of FIG. 8A, the gas diffuser chamber 85 is installed over the lock chamber. As seen in the example of FIG. 8B, to install the gas diffuser 84 over the sample 2, the height of the lock chamber 65 has to be increased. In this case, the volume Vb of the lock chamber 65 of FIG. 8B is larger than the volume Va of the lock chamber 65 of FIG. 8A, which requires longer time for venting or vacuuming and disadvantageously reduces the throughput of the lock chamber. Thus, with the use of the gas diffuser chamber 85, there is the merit of minimizing an increase in the time required to vacuum or vent the lock chamber. According to the invention, in an apparatus for processing a 12-inch wafer as an example, the inner width of the lock chamber 65 is about 350 mm, whereas the inner height of the lock chamber 65 is as small as about 30 mm, which leads to a reduction in the volume of the lock chamber and can reduce the time required to vacuum or vent the lock chamber.

Next, the size of the connection port 47-1 for connecting the gas diffuser chamber 85 with the lock chamber 65 will be described with reference to FIG. 4. As described above, the space within the gas diffuser chamber 85-1 is connected to the space within the lock chamber 65-1 through the connection port 47-1. It is desirable that the size of the connection port be as large as possible in order to slow the flow velocity of vent gas around the connection port. The size of the connection port 47-1 is substantially expressed by the following equations (1) and (2).

$$WA > 0.5 \times La \quad (1)$$

$$HB > 0.5 \times Db \quad (2)$$

where, WA in FIG. 3 denotes the width of the connection port, HB in FIG. 3 denotes the height of the connection port, La in FIG. 4 denotes the length of the gas diffuser, and Db in FIG. 4 denotes the diameter of the gas diffuser. Further, LC in FIG. 4 denotes the distance between the gas diffuser and a wall surface close to the gas diffuser. If LC is too small, foreign particles attaching to the wall close to the gas diffuser peel and fly off due to the force of gas blowing from the gas diffuser. For this reason, in general, it is desirable that LC be 5 mm or larger. The LC of 5 mm or larger is based on the condition that the diameter Db of the gas diffuser is about 10 to 20 mm, the length La is about 100 to 300 mm, and the gas supply quantity is about 40 to 200 L/min. In the case where, for example, the gas blow-out area of the gas diffuser is smaller or the gas supply quantity is larger, LC has to be larger, e.g., 10 mm or larger.

In the example of FIGS. 1 to 4, the gas diffuser 84 is installed parallel to the wafer surface, that is, installed laterally as viewed from the wafer surface, and the connection port 47-1 between the gas diffuser chamber and the lock chamber is oblong. With this, the velocity of gas flowing from the gas diffuser chamber to the lock chamber is made as slow as possible.

Further, by connecting the dedicated chamber for accommodating the gas diffuser to the side face of the lock chamber 65, the top face of the lock chamber can be opened and closed. Thereby, since the dedicated chamber does not block the opening and closing of the top face of the lock chamber, there is the merit of facilitating the maintenance of the lock chamber itself.

As described above, according to this embodiment, the dedicated chamber for accommodating the gas diffuser can be easily removed and cleaned, and the ease of maintenance around the gas diffuser is enhanced, which facilitates cleaning for reducing foreign particles.

Second Embodiment

Figure 9A:
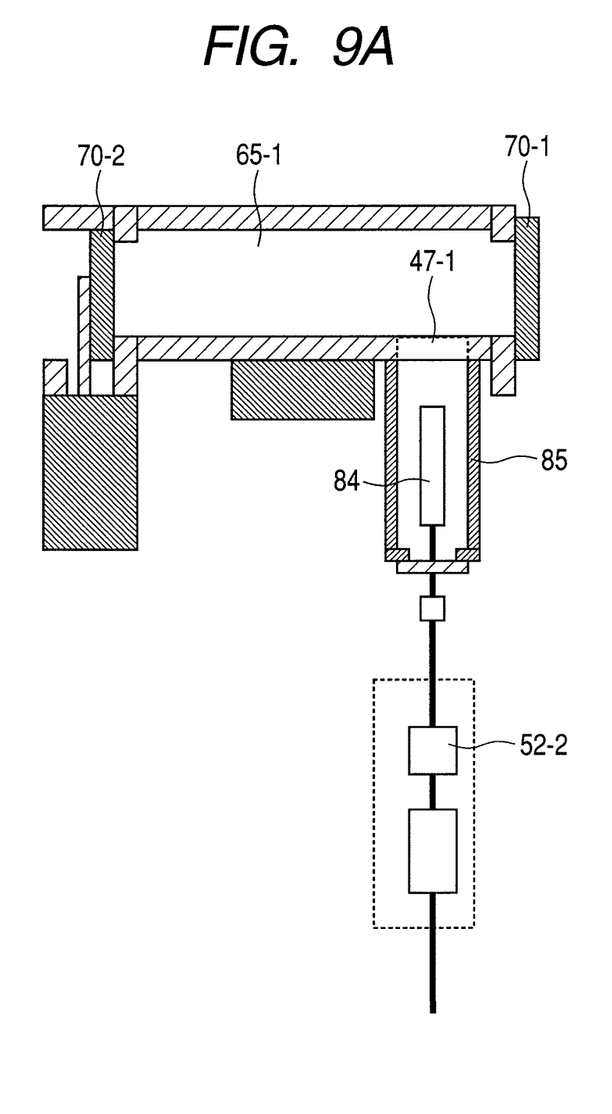
FIG. 9A is a schematic longitudinal sectional view of a lock chamber according a second embodiment of the invention.
Figure 9B:
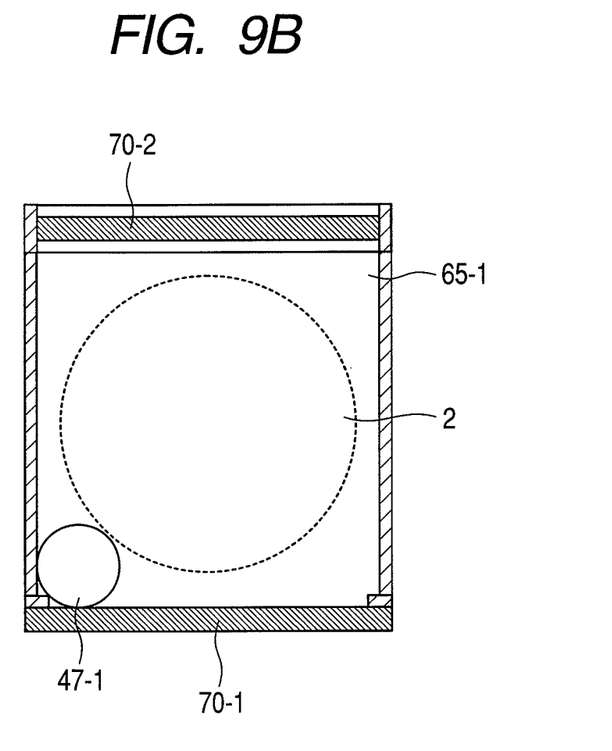
FIG. 9B is a plan view of the lock chamber according the second embodiment of the invention.

A second embodiment of the invention will be described with reference to FIGS. 9A and 9B. FIG. 9A is a longitudinal sectional view, and FIG. 9B is a plan view. If it is not possible to secure the connection port 47-1 of large size as in the first embodiment, it is possible to secure a connection port as shown in FIGS. 9A and 9B. That is, a connection port 47-1 for connecting the gas diffuser chamber 85 is opened on the bottom face of the lock chamber 65 and in the corner outside the periphery of the wafer 2.

According to this embodiment as well, the dedicated chamber for accommodating the gas diffuser can be easily removed and cleaned, and the ease of maintenance around the gas diffuser is enhanced, which facilitates cleaning for reducing foreign particles. However, in this embodiment, the size of the connection port 47-1 has to be smaller than that of FIG. 4. Accordingly, the flow velocity of vent gas at the connection port becomes higher, so that there is the demerit of increasing the risk of the fly-off of foreign particles.

Third Embodiment

Figure 10:
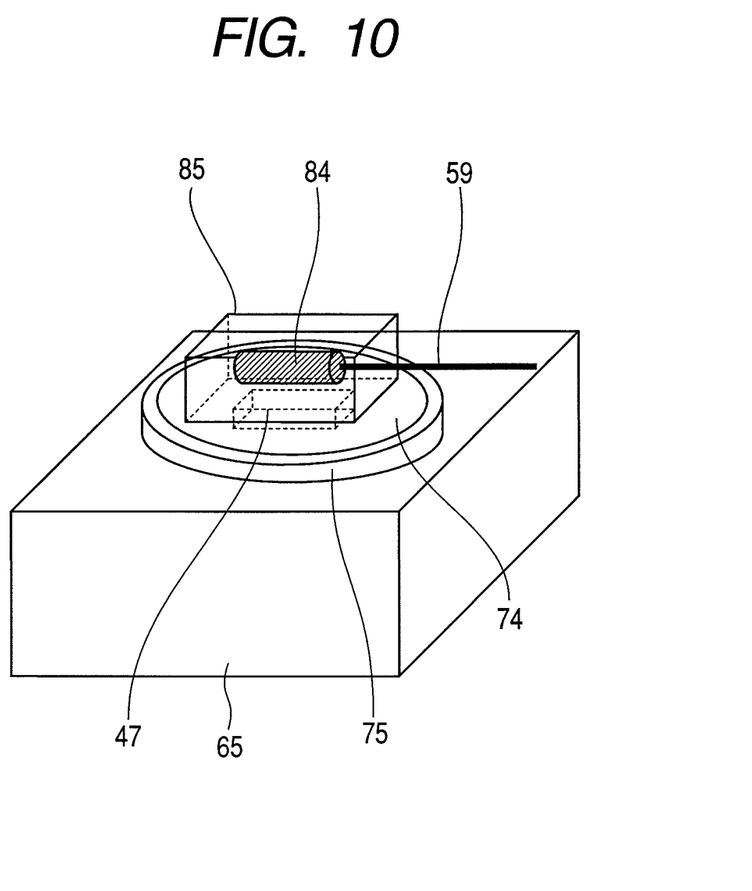
FIG. 10 is a perspective view of a lock chamber according a third embodiment of the invention.
Figure 11:
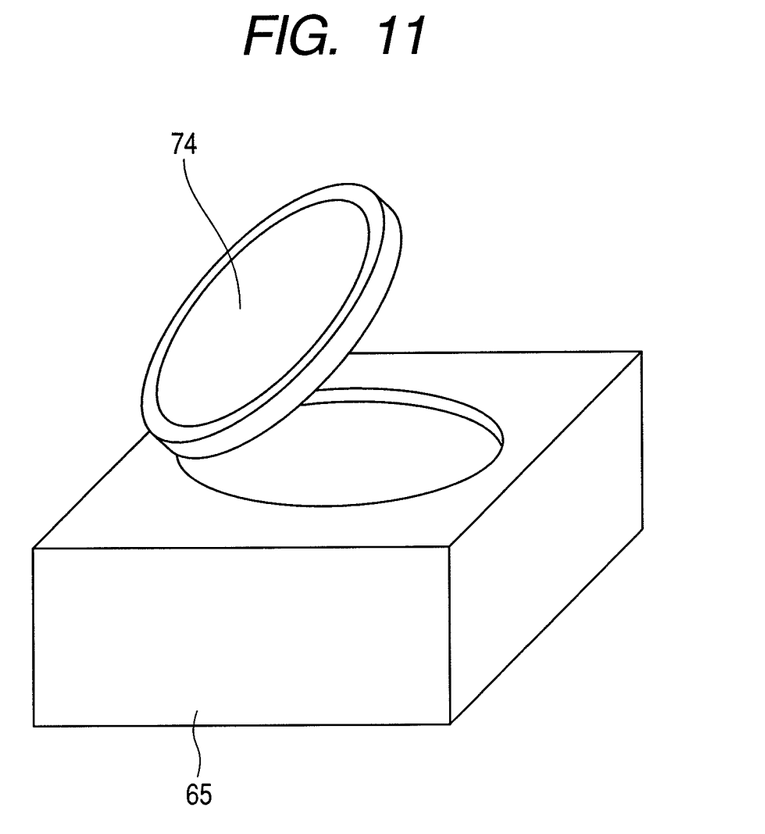
FIG. 11 is a perspective view of assistance in explaining the operation of the third embodiment of the invention.

A third embodiment of the invention will be described with reference to FIGS. 10 and 11. In this embodiment, the gas diffuser 84 is installed over the lock chamber 65. In the example of FIG. 10, a transparent window 74 inside which a connection port 47 is provided is installed over the lock chamber 65, and the gas diffuser chamber 85 is installed over the transparent window 74. It is possible to check an inner state of the lock chamber 65 through the transparent window 74. The specific configurations of the gas diffuser 84 and the gas diffuser chamber 85 are basically the same as those of the first embodiment.

According to this embodiment, the ease of maintenance around the gas diffuser is enhanced, which facilitates cleaning for reducing foreign particles.

This embodiment has the same effect in preventing the fly-off of foreign particles as the first embodiment (FIG. 4), but there is the demerit of reducing the effective area of the window. It is desirable that the window 74 can be opened during maintenance etc. as shown in FIG. 11. In the example of FIG. 11, the illustration of the gas diffuser etc. is omitted. Further, even in the case of no transparent window, it is desirable that the top face of the lock chamber can be opened. Accordingly, in the case where the gas diffuser chamber is installed over a top lid or a top window, there is a possibility of occurrence of a need to remove a gas line 59 for supplying vent gas to the gas diffuser every time the top lid or window is opened.

Fourth Embodiment

Figure 12:
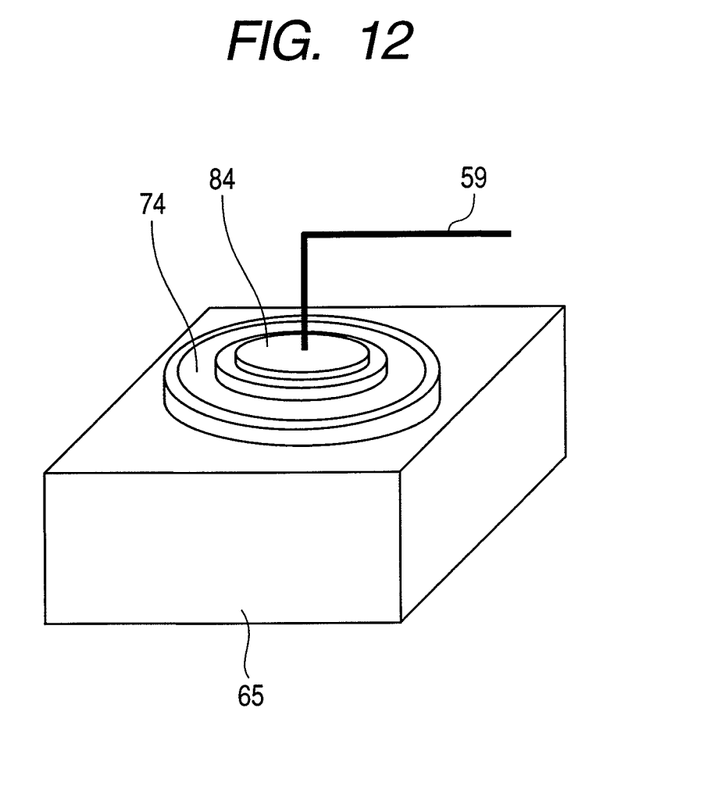
FIG. 12 is a perspective view of a lock chamber according a fourth embodiment of the invention.
Figure 13:
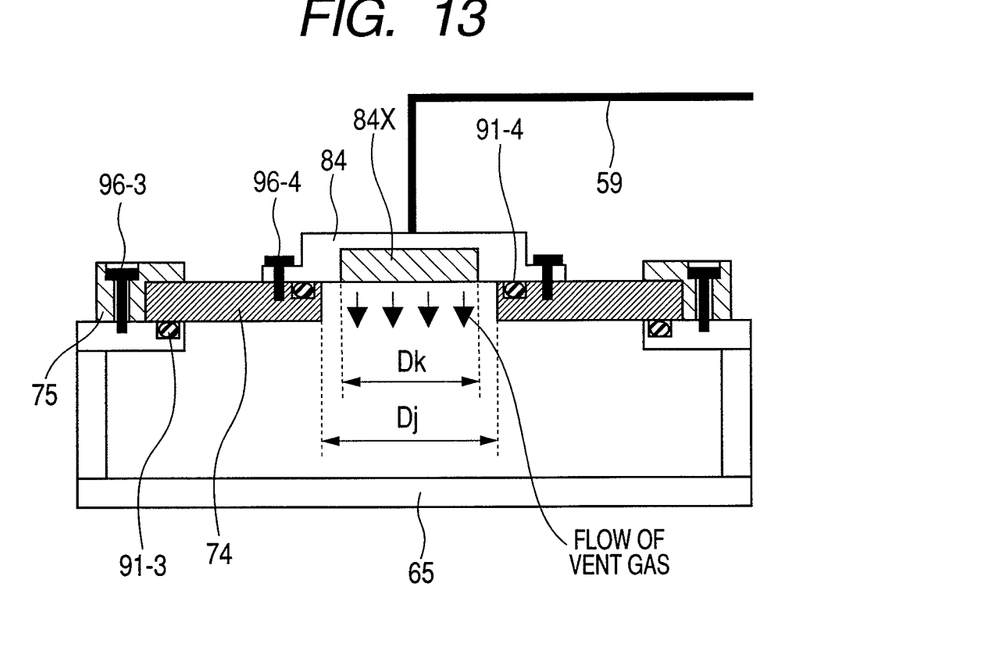
FIG. 13 is a longitudinal sectional view of the lock chamber according the fourth embodiment of the invention.

A fourth embodiment of the invention will be described with reference to FIGS. 12 and 13. In the case where the gas diffuser is installed over the top window 74, it is also possible to employ a flat-type gas diffuser 84 having a flat surface through which gas blows. FIGS. 12 and 13 show this example. FIG. 12 is a perspective view sterically showing the lock chamber of FIG. 13. The window 74 is fixed over the lock chamber 65 through the use of a frame 75. In the center of the window, there is a hole of diameter Dj as a connection port. A flat-type (plate-type) gas diffuser 84 is fixed over the window 74 with screws 96-4. In FIG. 13, reference numeral 84X denotes a porous body, and reference symbol Dk denotes the diameter of the exposed portion of the porous body. Further, arrows denote the flow of vent gas. As a matter of course, it is desirable to satisfy the following equation (3).

$$Dj \geq Dk \tag{3}$$

According to this embodiment, the ease of maintenance around the gas diffuser is enhanced, which facilitates cleaning for reducing foreign particles. However, since the gas diffuser is also installed over the window, there are the demerit of reducing the effective area of the window and the demerit that there is a possibility of occurrence of a need to remove a vent gas line 59 from the gas diffuser at the time of opening the window.

Fifth Embodiment

Next, description will be made as to a method of installing a gas diffuser on a plasma processing chamber 60 side as a fifth embodiment of the invention. Since plasma is generated in the processing chamber, it is undesirable that the gas diffuser be installed in a directly exposed state in the processing chamber. This is because there is a risk of contaminating the gas diffuser due to ion irradiation and deposition or corrosive radical irradiation.

Figure 14:
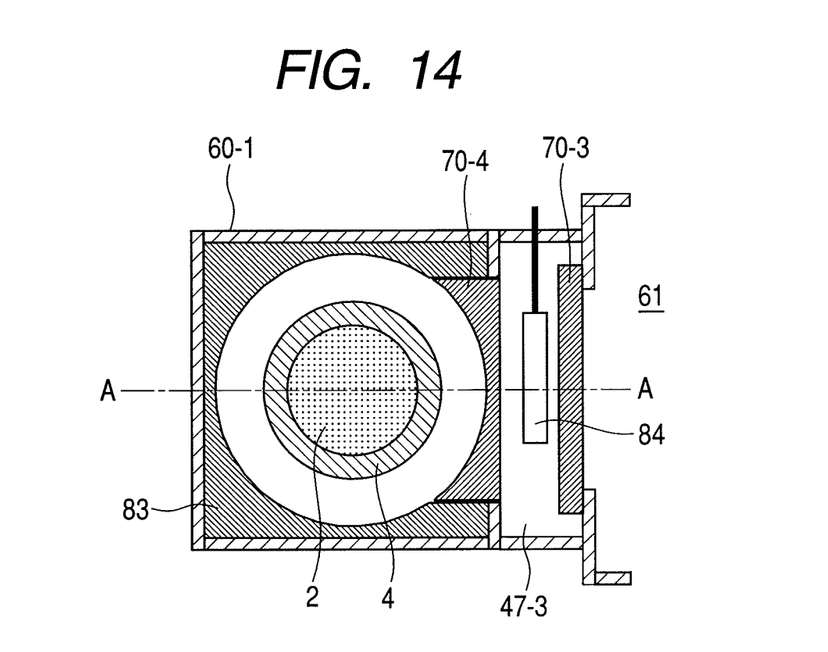
FIG. 14 is a schematic sectional view showing a configuration around gate valves installed at a connection port between a processing chamber and a vacuum transfer chamber, according to a fifth embodiment of the invention.
Figure 15:
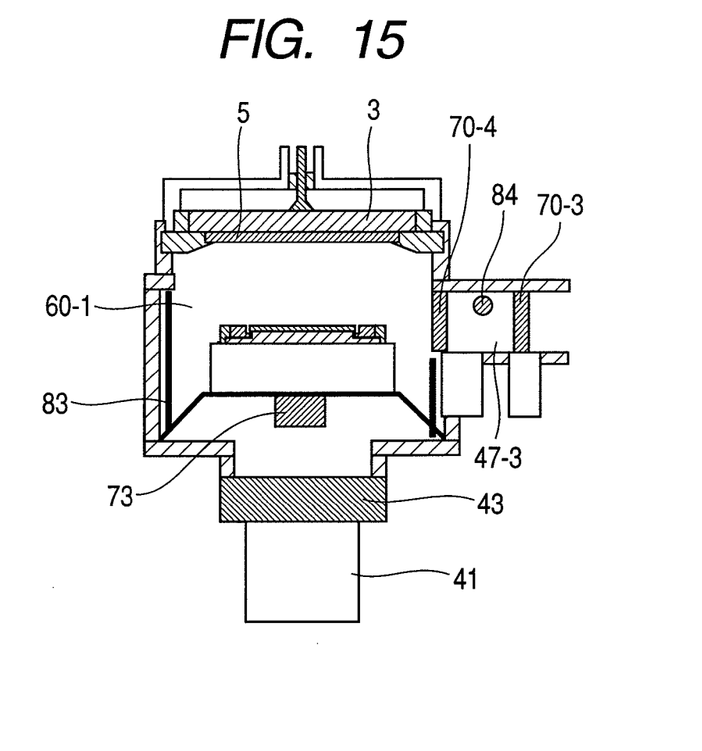
FIG. 15 is a longitudinal sectional view taken along line A-A of FIG. 14.

For this reason, except in the case of venting the plasma processing chamber for wet cleaning (overhaul cleaning of swap parts) or the like, it is desirable that the gas diffuser be installed in an enclosed space other than the space within the processing chamber to avoid plasma irradiation. In this invention, two gate valves are installed at a connection port between a vacuum processing chamber and the vacuum transfer chamber, and a gas diffuser chamber is installed in a space enclosed by the two gate valves. FIGS. 14 and 15 show this configuration.

FIG. 14 is a schematic sectional view showing a configuration around the gate valves installed at the connection port between the processing chamber 60-1 and the vacuum transfer chamber 61. FIG. 15 is a longitudinal sectional view taken along line A-A of FIG. 14.

In the vacuum processing apparatus, two gate valves 70-3 and 70-4 are installed at a connection port (connection space) 47-3 for connecting the vacuum processing chamber 60-1 with the vacuum transfer chamber 61. That is, there are provided a first gate valve 70-4 which forms a part of a side wall of the vacuum processing chamber 60-1, a second gate valve 70-3 which forms a part of a side wall of the vacuum transfer chamber 61, and a cylindrical gas diffuser 84 for venting the vacuum processing chamber, and the gas diffuser 84 is installed in the connection space (connection port) sandwiched between the two gate valves. Further, a mounting electrode 4 for mounting the sample 2 is moved up and down by an up-and-down drive mechanism 73. A shower plate 5 is installed under an antenna 3 through a gas dispersion plate, and processing gas is supplied into the processing chamber through gas holes (not shown) provided in the shower plate 5. Reference numeral 41 denotes a turbo-molecular pump; 43, a butterfly valve unit; and 83, an inner case. The connection port 47-3 for accommodating the gas diffuser 84 is located at approximately the same height as the mounting electrode 4, and the gas diffuser 84 is located at a position slightly higher than the transfer surface of the sample 2. The gas diffuser 84 is installed in a direction perpendicular to the transfer direction of the sample 2.

The gate valve 70-3 adjacent to the vacuum transfer chamber is a valve for pressure-wise isolating the vacuum transfer chamber from the processing chamber, and has the function of keeping the vacuum transfer chamber under vacuum even if the processing chamber is opened to the atmosphere. On the other hand, the gate valve 70-4 is also called a process valve. The gate valve 70-4 allows the processing chamber to be axisymmetric in terms of high-frequency power for generating plasma, and the gate valve element is shaped like an arc as viewed from above. With this configuration, the inner surface of the inner case 83 and the surface of the process valve 70-4 adjacent to the processing chamber exist on the circumference of a circle.

This process valve 70-4 also has the effect of preventing contamination by deposition radical or corrosive radical around the port for connecting the vacuum transfer chamber with the processing chamber. By closing the process valve, the space of the connection port 47-3 is protected against contamination by deposition radical or corrosive radical. Accordingly, it is desirable that the gas diffuser be installed in this area. That is, when the processing chamber is vented, vent gas is supplied from the gas diffuser with the process valve 70-4 opened and the gate valve 70-3 closed, thereby returning the processing chamber to the atmosphere.

This embodiment can provide the vacuum processing apparatus having less frequency of maintenance.

Figure 16:
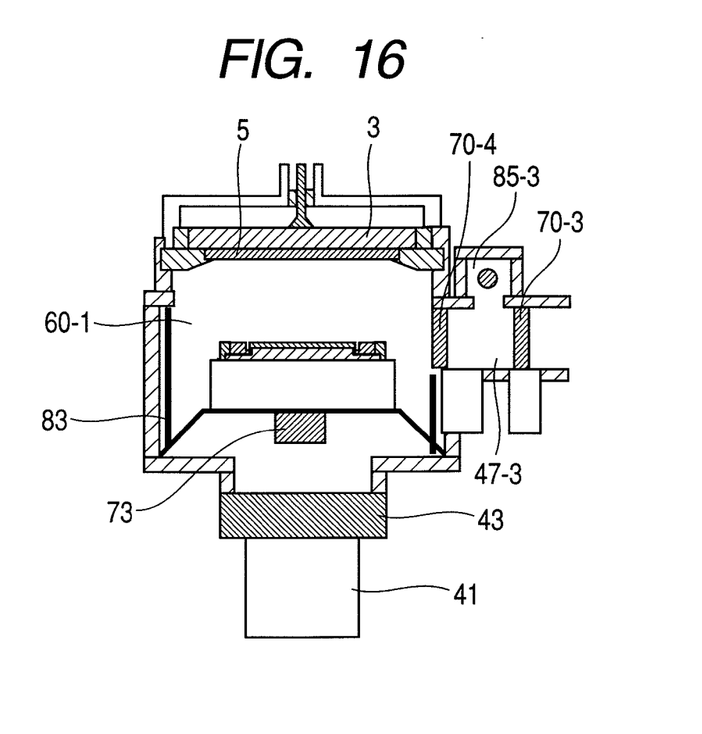
FIG. 16 is a longitudinal sectional view showing a modification of the fifth embodiment of the invention.

In the case where the cross section of the connection port 47-3 is small, that is, the height is small so that the gas diffuser cannot be installed, as shown in FIG. 16 a gas diffuser chamber 85-3 communicated with the connection port is installed over the connection port 47-3 (the transfer path of the sample 2), thus securing a space for accommodating the gas diffuser 84.

In the plasma processing apparatus shown in FIG. 1, all of the gas diffuser chambers 85 (85-1 to 85-7) and the gas diffusers 84 incorporated therein do not need to have the same structure, and each of the embodiments can be applied thereto as appropriate.

The invention is applicable not only to the etching processing apparatus described in each embodiment, but also to general vacuum processing apparatuses which transfer samples while supplying vent gas, e.g., a plasma CVD apparatus and a semiconductor inspection apparatus using a CD-SEM (critical dimension scanning electron microscope) or the like.

What is claimed is:

1. A vacuum processing apparatus comprising:
a lock chamber configured to receive a sample and to vary a pressure therein between an atmosphere pressure and a vacuum pressure;
a vacuum transfer chamber;
a gate valve disposed between the vacuum transfer chamber and the lock chamber at one side face of the lock chamber;
a gas diffuser which introduces a gas into the lock chamber; and
a diffuser chamber configured to accommodate the gas diffuser which is disposed therein;
wherein the vacuum transfer chamber is coupled to the lock chamber and to the vacuum processing chamber to enable transfer of the sample between the lock chamber and the vacuum processing chamber via the one side face of the lock chamber;
wherein the diffuser communicates with the lock chamber via a connection port and is detachably connected with an outer wall of another side face of the lock chamber which extends perpendicular to the one side face of the lock chamber, the diffuser chamber and the gas diffuser disposed therein being arranged outside of the lock chamber;
wherein the gas diffuser is elongated and cylindrically shaped with plural gas introducing holes on a surface thereof and disposed laterally as viewed from a surface of the sample which is transferred into the lock chamber, and a cylindrical axis of the gas diffuser extends substantially in parallel to the outer wall of the another side face of the lock chamber;
wherein the connection port includes an opening in the outer wall of the another side face of the lock chamber communicating between the lock chamber and the diffuser, the opening having an elongated shaped width in a horizontal direction extending in parallel with the cylindrical axis of the gas diffuser and having a height in a vertical direction which is perpendicular to the horizontal direction of the elongated shaped width and which is smaller than a height of the lock chamber, and
wherein the opening in the outer wall of the another side face of the lock chamber provides an open communication path between the lock chamber and the diffuser chamber without any member being disposed in the opening.

2. The vacuum processing apparatus according to claim 1, wherein a top face of the lock chamber is configured so as to be opened as closed.

3. The vacuum processing apparatus according to claim 2, wherein a window is installed on the top face of the lock chamber.

4. The vacuum processing apparatus according to claim 2, wherein the vacuum processing apparatus is configured to satisfy the following equations (1) and (2), $$WA > 0.5 \times La \quad (1)$$

$$HB > 0.5 \times Db \quad (2)$$

where WA denotes the elongated shaped width of the opening of the connection port, HB denotes the height of the opening of the connection port, La denotes a length of the gas diffuser, and Db denotes a diameter of the gas diffuser.

5. The vacuum processing apparatus according to claim 1, wherein the vacuum processing apparatus is configured to satisfy the following equations (1) and (2), $$WA > 0.5 \times La \quad (1)$$

$$HB > 0.5 \times Db \quad (2)$$

where WA denotes the elongated shaped width of the opening of the connection port, HB denotes the height of the opening of the connection port, La denotes a length of the gas diffuser, and Db denotes a diameter of the gas diffuser.

6. The vacuum processing apparatus according to claim 1, wherein the diffuser chamber communicates directly with the lock chamber via the connection port including the opening in the outer wall of the another side face of the lock chamber.

* * * * *